(12) United States Patent  
Rietzel (10) Patent No.: US 7,513,141 B2  
(45) Date of Patent: Apr. 7, 2009

(54) METHOD FOR DIFFERENTIALLY PUMPING ENDBLOCK SEAL CAVITY

(75) Inventor: James G. Rietzel, Antioch, CA (US)

(73) Assignee: Applied Films Corporation, Longmont, CO (US)

( * ) Notice: Subject to any disclaimer, the term of this patent is extended or adjusted under 35 U.S.C. 154(b) by 906 days.

(21) Appl. No.: 10/916,261

(22) Filed: Aug. 10, 2004

(65) Prior Publication Data

US 2005/0053481 A1 Mar. 10, 2005

Related U.S. Application Data

(60) Provisional application No. 60/501,600, filed on Sep. 9, 2003.

(51) Int. Cl.
*G01M 3/04* (2006.01)
(52) U.S. Cl. .............................. 73/46; 73/40
(58) Field of Classification Search ............ 73/40, 73/46; 417/53, 63, 313
See application file for complete search history.

(56) References Cited

U.S. PATENT DOCUMENTS

| | | | |
|---|---|---|---|
| 4,993,917 A * | 2/1991 | Kulle et al. ............ | 415/105 |
| 5,096,562 A | 3/1992 | Boozenny et al. | |
| 5,412,977 A * | 5/1995 | Schmohl et al. ............ | 73/46 |
| 5,709,544 A | 1/1998 | Wurtz | |
| 5,755,886 A | 5/1998 | Wang et al. | |
| 5,814,195 A | 9/1998 | Lehan et al. | |
| 6,286,546 B1 | 9/2001 | Mueller | |
| 6,802,689 B2 * | 10/2004 | Nogiwa ............ | 415/26 |
| 2003/0136672 A1 | 7/2003 | Barrett | |

OTHER PUBLICATIONS

Hill et al., "Coated Glass Applications and Markets," *The BOC Group, Inc.*, ISBN 0-914289-01-2, 1999, pp. 1-143.

* cited by examiner

*Primary Examiner*—Daniel S Larkin
(74) *Attorney, Agent, or Firm*—Davis Wright Tremaine LLP (57) ABSTRACT

A system for providing a seal between a rotating part and a stationary part that comprises two seals in series separated by a cavity is disclosed. The cavity may be at low pressure and failure of either seal may be detected by a change in cavity pressure. An alarm may be triggered when cavity pressure rises above a threshold, or when it remains above a threshold for more than a predetermined period of time. In a system comprising multiple cavities, a cavity may be selectively isolated to determine if a seal associated with that cavity is experiencing a leak.

8 Claims, 9 Drawing Sheets

METHOD FOR DIFFERENTIALLY PUMPING ENDBLOCK SEAL CAVITY

This application claims the benefit of Provisional application No. 60/501,600, filed on Sep. 9, 2003.

BACKGROUND OF THE INVENTION

This invention relates to cylindrical magnetrons and specifically to methods and systems for sealing endblocks used in cylindrical magnetrons. The cylindrical magnetron is used in a large coating machine for coating very large sheets of glass or other materials. One application where these sheets of glass are used is in construction of curtain wall buildings where a single glass sheet can be up to 15 feet wide by about 20 plus feet high. The sheets are run through the coating machine shortly after the glass is manufactured. Thus, these are large-scale machines, which must rapidly and evenly coat glass as quickly as it can be manufactured. In addition to the quality of the coating the magnetron deposits upon the glass, dependability and serviceability of the magnetron is of the utmost importance.

This is not an easy task taking into account the constraints of the process that is involved. A cylindrical magnetron sputters material from a rotating target tube onto the glass as it is transported past the target. In order to coat such a large piece of glass the target tube can be up to 15 feet in length and 6 inches in diameter and can weigh 1700 pounds. Another complication is that the sputtering actually erodes the target tube during the sputtering process, so the target tube is constantly changing shape during its serviceable lifetime. The sputtering process can require that an extremely high AC or DC power (400 amps, 150 kW) be supplied to the target. This power transfer creates extreme heat in the target tube and the surrounding components, which must be cooled in order assure proper performance and to avoid catastrophic failure of the magnetron. Thus, water is pumped through the center of the rotating target tube at high pressure and flow rate.

Figure 1A:
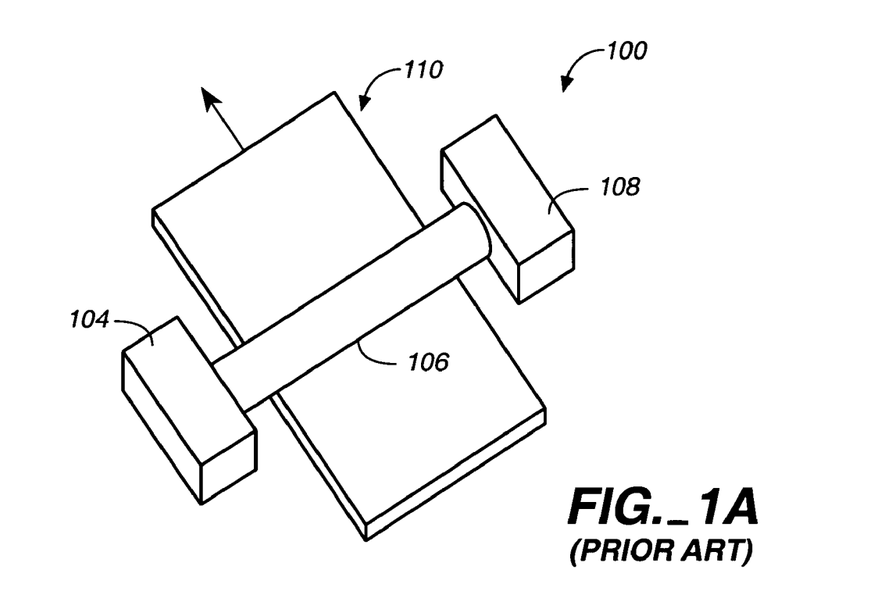
FIG. 1A shows a magnetron used to coat substrates.
Figure 1B:
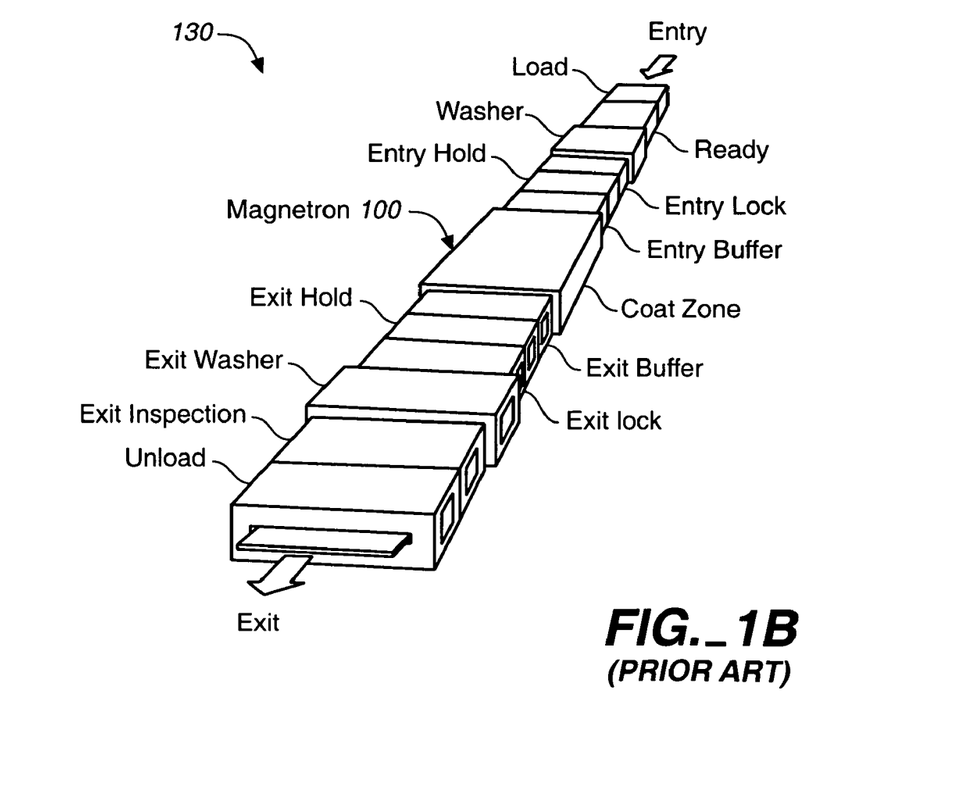
FIG. 1B shows a coating system that includes the magnetron of FIG. 1A.

Rotating such a large target tube in such an environment is a difficult task. FIG. 1A depicts magnetron 100 for illustrative purposes. FIG. 1B shows magnetron 100 integrated into a large glass coating system 130. Glass coating system 130 maybe several hundred feet long and contain many magnetrons. Target tube 106 is supported by two endblocks 104 and 108 as glass sheet 110 passes by. The endblocks 104 and 108 generally supply cooling water, support and rotate the target tube, support a stationary magnetic array within the rotating target tube, and transfer the large amounts of electricity needed for the sputtering process. Effectively transferring electrical power to a rotating target tube is also a complex problem. Maintaining electrical isolation in a sputtering process is also crucial to continually laying down a uniform coating on the glass. If the drive system is not properly electrically isolated from the sputtering process, it will affect the quality of coating deposited upon the glass. The sputtered material may in fact also coat the drive and electrical components of the magnetron itself rather than the glass if they are not properly isolated. Aside from resulting in a poor coating, this has many other ramifications on the continuous reliable operation of the magnetron. For further information please refer to "Coated Glass Application and Markets" by Russell J. Hill and Steven J. Nadel, The BOC Group, 1999 (ISBN #0-914289-01-02).

Efficient and effective sputtering also requires that the process take place in a vacuum or a reduced pressure relative to atmosphere. One or more vacuum pumps may be connected to provide vacuum within a coater. Thus, endblocks must have a very robust sealing system to prevent air or high-pressure water from leaking into the vacuum environment as the target is rotated. Typically sputtering takes place at a pressure of $2\times10^{-3}$ Torr and the chamber may be pumped to a base pressure of about $2\times10^{-6}$ Torr.

Maintaining a good seal around a rotating part may be achieved using lip seals that seal against the rotating surface. However, such seals suffer from wear over time and may eventually fail allowing air to leak past the seal. Such a leak may not be detected in time to prevent damage to products in the coater.

Therefore, there is a need for a robust sealing system that allows a vacuum seal to be maintained between a stationary part and a rotating part and that allows early detection of failure of a seal. There is also a need for a method of determining which seal has failed where multiple seals are present in a coater.

SUMMARY

A sealing system has two seals that form a cavity between them. The seals may extend to seal the gap between a moving part (such as a rotating shaft) and a stationary part. The sealing system seals between a vacuum on one end and atmospheric pressure on the other end. The cavity is pumped through a restriction so that a leak into the cavity causes pressure in the cavity to rise or fall measurably. A gauge monitors cavity pressure. When a leak develops, the rise or fall in pressure may cause an alarm to be sent to a user.

An alarm may be sent immediately when a threshold pressure is exceeded, or alternatively after the threshold pressure is exceeded for a predetermined period of time. Requiring an excess pressure for a predetermined period reduces the frequency of false alarms caused by momentary seal failures. Similarly, a drop in pressure may cause an alarm to be sent either immediately or after a predetermined period of time.

Multiple seal cavities in a coating system may be connected together so that they may be pumped together. A manifold connects lines running to the cavities. The manifold has valves allowing individual cavities to be selectively connected to or isolated from a vacuum source. A restriction is located between the manifold and the vacuum source. When a leak is detected, individual cavities may be isolated to determine which cavity contains the leak. Based on the nature of the leak, an operator may determine whether a seal should be replaced immediately or whether the coater should continue running.

A seal cavity may be pumped by a dedicated vacuum pump or a pump shared by multiple seal cavities. Alternatively, a pump used by the coating system may be used as a source of vacuum. In this case, no additional pump is required for the seal cavities. Another advantage of using a coater pump to provide vacuum for the seal cavities is that the seal cavities are automatically brought to the appropriate pressure for any coater condition. When the coater is under vacuum during operation, the seal cavities are under vacuum. When the coater is vented to atmosphere for maintenance, the seal cavities are at atmosphere. This automatic linking of pressure in the coater and in the seal cavity avoids problems caused by a pressure difference when seal cavity pressure is controlled directly by an operator.

DETAILED DESCRIPTION

Examples of endblocks that may be used for rotating water-cooled targets are given in U.S. Pat. No. 6,736,948, entitled "Cylindrical AC/DC magnetron with compliant drive system and improved electrical and thermal isolation," by Richard L. Barrett, filed on Jan. 18, 2002. This Patent is hereby incorporated by reference in its entirety.

Typically, endblocks such as endblocks 104 and 108 of FIG. 1A are not identical and may serve different functions. One endblock may be a drive endblock used to rotate the target 106. The other may be a water endblock used to supply cooling water to the target. These different endblocks have different design considerations but both hold a rotating part while maintaining a good vacuum seal between the rotating part and the static parts that surround it.

Figure 2:
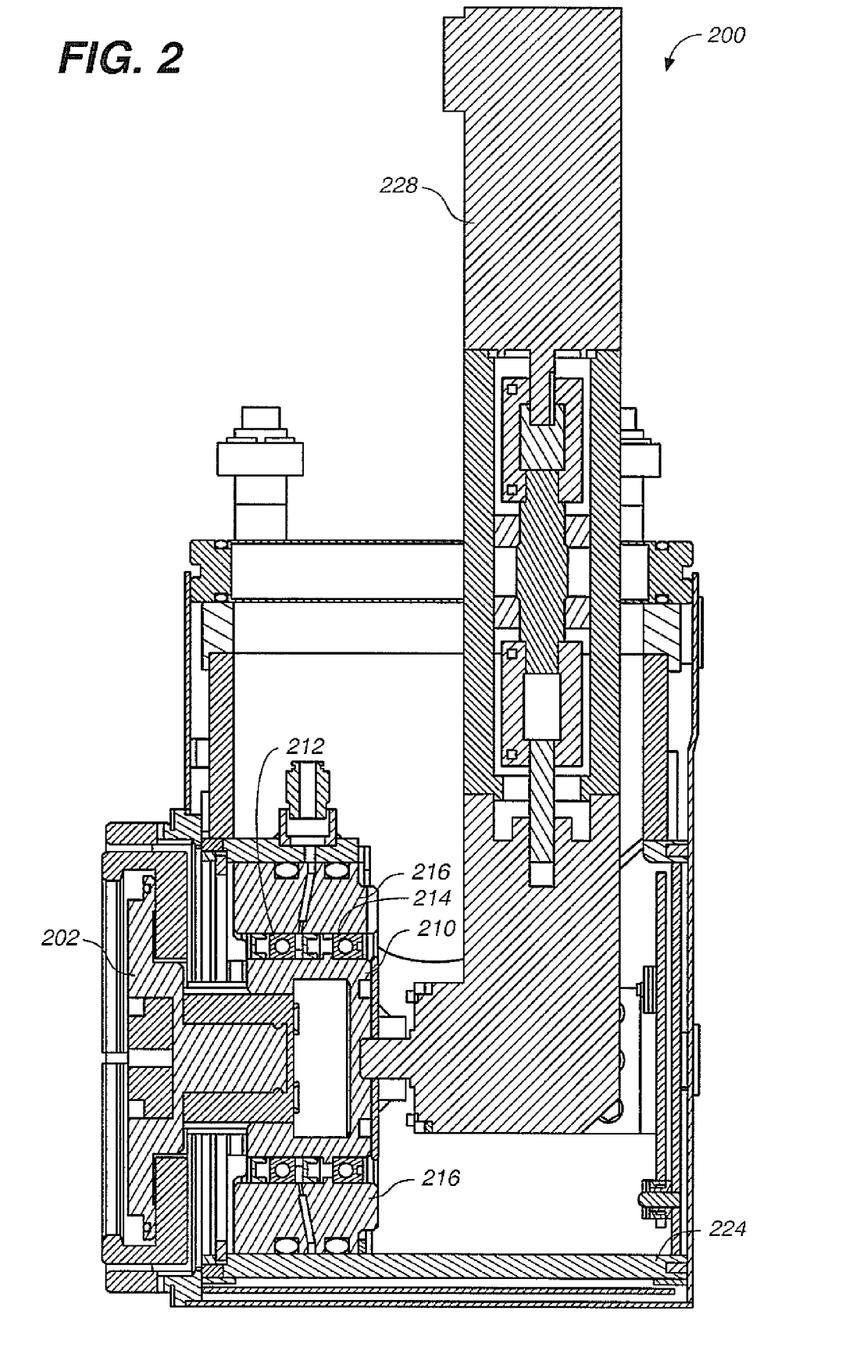
FIG. 2 shows a drive endblock used in the magnetron of FIG. 1A.

FIG. 2 shows a drive endblock 200. A drive endblock rotates the target during deposition. Thus, the drive endblock allows mechanical coupling between a drive motor 228 at atmosphere and a drive endcap 202 that is under vacuum. Some "wiggle room" is allowed between parts to allow for expansion of the parts at high temperature and to allow variation in part dimensions (within tolerance) between moving parts.

Figure 3:
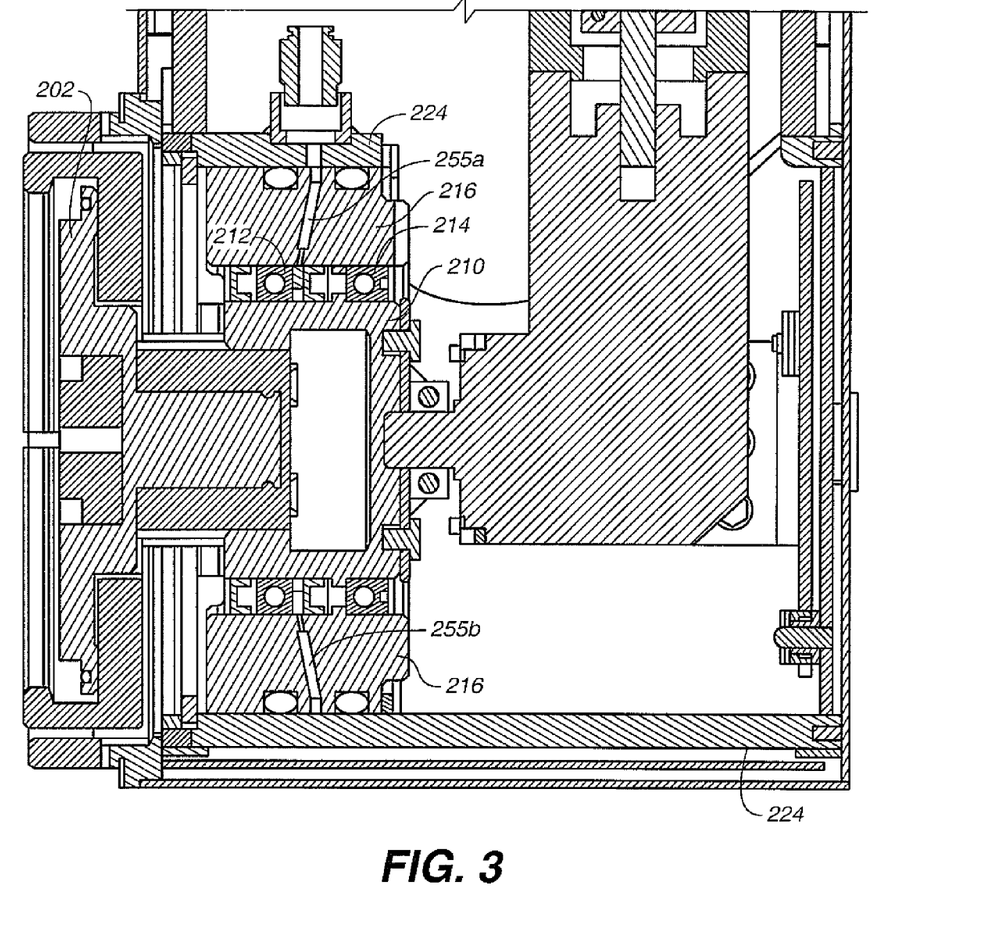
FIG. 3 shows a more detailed view of the drive endblock of FIG. 2.

FIG. 3 shows a portion of drive endblock 200 of FIG. 2. Bearings 212 and 214 allow rotation of drive cup 210 within isolation housing 216. Isolation housing 216 is held within primary housing 224 in a manner that allows some flexing between these parts. The gap between drive cup 210 and isolation housing 216 and the gap between isolation housing 216 and primary housing 224 are sealed because vacuum is present on one end of these gaps while atmosphere is present on the other end.

Figure 4:
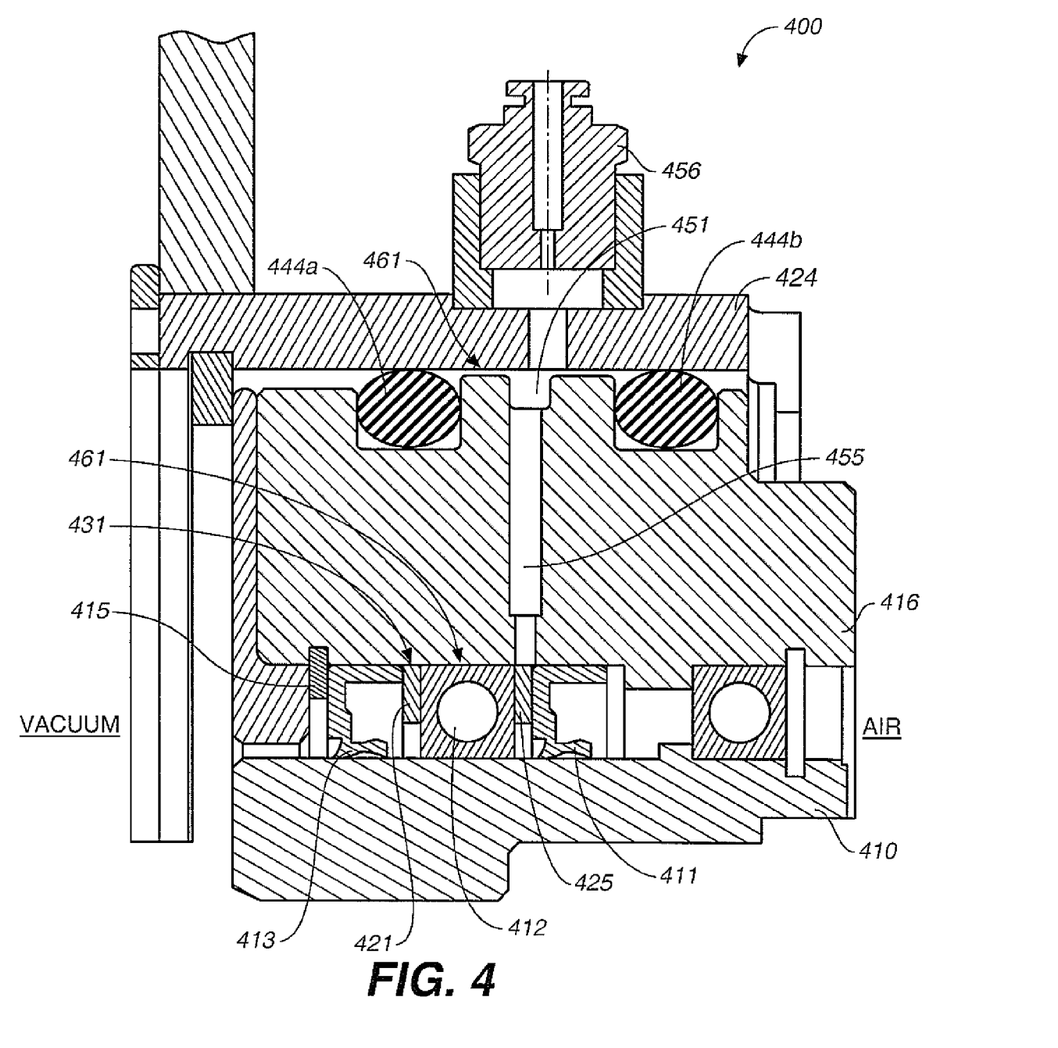
FIG. 4 shows a sealing system used in the drive endblock of FIGS. 2 and 3.

FIG. 4 shows a more detailed view of a sealing system 400 that may be used to maintain vacuum in an endblock such as drive endblock 200 of FIGS. 2-3. Reference numbers used in FIG. 4 correspond to those in FIGS. 2-3 where similar parts are referenced but numbers are incremented by 200 in FIG. 4. For example, drive cup 410 in FIG. 4 corresponds to drive cup 210 of FIGS. 2-3. Two types of seals are used in sealing system 400, lip seals (seal rings) and O-rings (compliant seal rings). Two lip seals 411 and 413 are located in the gap between drive cup 410 and isolation housing 416. The two lip seals 411 and 413 are inserted so that if one fails, the other one will still seal the gap between drive cup 410 and isolation housing 416. Atmosphere is to the right in FIG. 4 with vacuum to the left creating a pressure differential from right to left. Lip seals 411 and 413 are C-shaped in cross-section. They are inserted with the opening towards the side with higher pressure. Thus, the pressure difference across each lip seal pushes the lip seal outwards to force it into compliance with the sealing surfaces. Lip seal 413 is held in position by a retaining ring 415. Because the pressure differential is from right to left, the force on lip seal 413 is generally towards the left so lip seal 413 is restrained in this direction by retaining ring 415. Lip seal 413 is separated from bearing 412 by a spacer 421. Bearing 412 is separated from lip seal 411 by a spacer 425. Between lip seal 411 and lip seal 413 a cavity 431 is formed that is isolated from both atmosphere on one side and vacuum on the other side. Cavity 431 is defined by drive cup 410 and isolation housing 416, which form its inner and outer surfaces respectively, and by lip seals 411 and 413, which form the end surfaces of cavity 431. Cavity 431 is ring shaped, extending around drive cup 410. Bearing 412 and spacer 421 are within cavity 431 but neither of these components forms a seal. Thus, gas may flow within cavity 431. Therefore, cavity 431 may be treated as an undivided volume.

Two O-rings 444a and 444b are located in the gap between isolation housing 416 and primary housing 424. O-rings 444a and 444b are located so that if one fails then the other will still seal the gap between isolation housing 416 and primary housing 424. A seal cavity 451 is formed between compliant seal rings 444a and 444b. Cavity 451 is defined by isolation housing 416 and primary housing 424, which form its inner and outer surfaces respectively, and by compliant seal rings 444a and 444b, which form the end surfaces of cavity 451. Cavity 451 is ring-shaped, extending around isolation housing 416.

A channel 455 connects cavity 451 and cavity 431. Channel 455 allows gas to flow between cavity 451 and cavity 431 so that they form a single endblock seal cavity 461. More than one channel may be used to connect cavities in this way to provide better communication between cavities (for example, two channels 255a and 255b are shown in endblock 200 of FIG. 3). Endblock seal cavity 461 is connected to port 456. Port 456 may be connected to a vacuum pump to maintain a reduced pressure in endblock seal cavity 461. Thus, the pressure in endblock seal cavity 461 may be maintained at some intermediate pressure between atmospheric pressure and the high vacuum surrounding the target.

Figure 5:
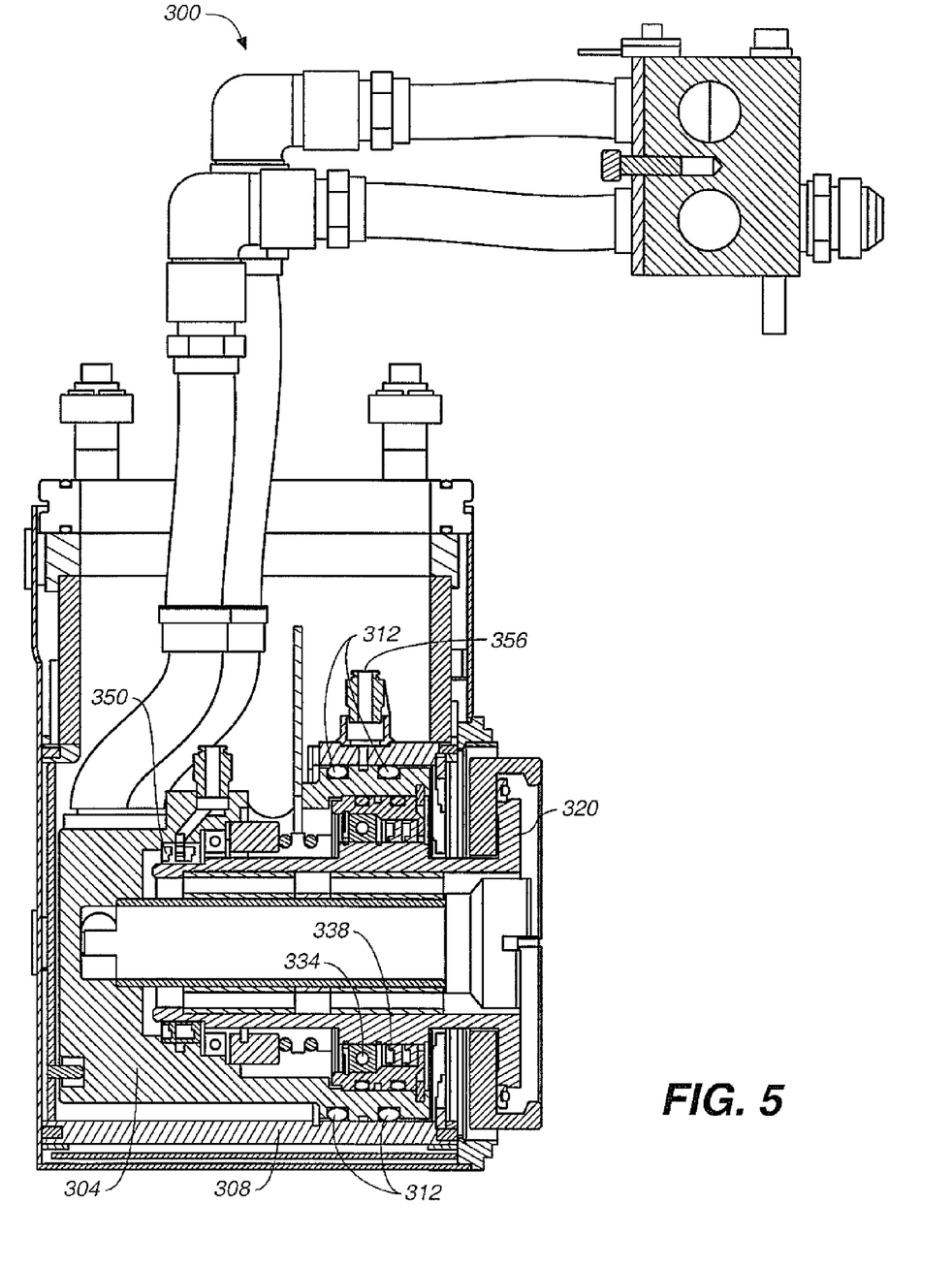
FIG. 5 shows a water endblock used in the magnetron of FIG. 1A.

FIG. 5 shows a water endblock 300. A water endblock supplies cooling water to a target and provides a return path for cooling water from a target while a target is rotating and is under vacuum. It also allows electrical power to be fed to the target by means of a brush and commutator set-up maintained at atmospheric pressure. Seals 350 prevent water from entering the brush cavity while other seals maintain vacuum integrity from the brush cavity. The arrangement of bearings and seals in water endblock 300 is somewhat different from that used in a drive endblock, such as drive endblock 200. However, both water and drive endblocks are designed to allow rotation of a part that extends from atmosphere to vacuum while maintaining a seal between atmosphere and vacuum. Both allow some "wiggle room" between parts to allow for expansion with increased temperature and to provide clearances necessary for rotation.

Figure 6:
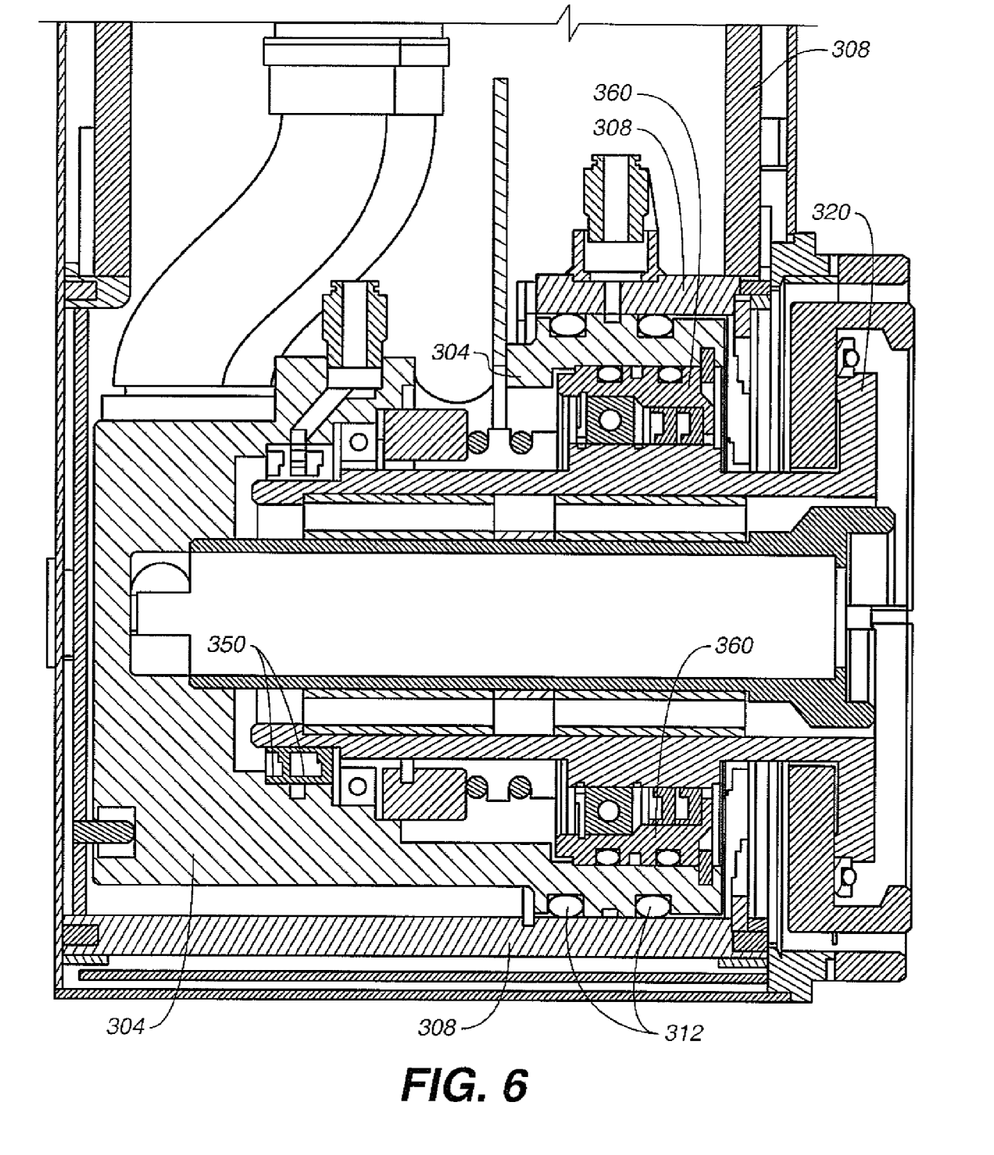
FIG. 6 shows a more detailed view of the water endblock of FIG. 5.

FIG. 6 shows a portion of a water endblock 300 in more detail. Water spindle 320 is within bearing and seal carrier 360. Bearing and seal carrier 360 is within water endblock isolation housing (WEIH) 304. WEIH 304, in turn, is within water endblock primary housing (WEPH) 308. Between pairs of concentric parts gaps exist that extend from vacuum to atmosphere. These gaps are sealed to maintain vacuum in the area around the target.

Figure 7:
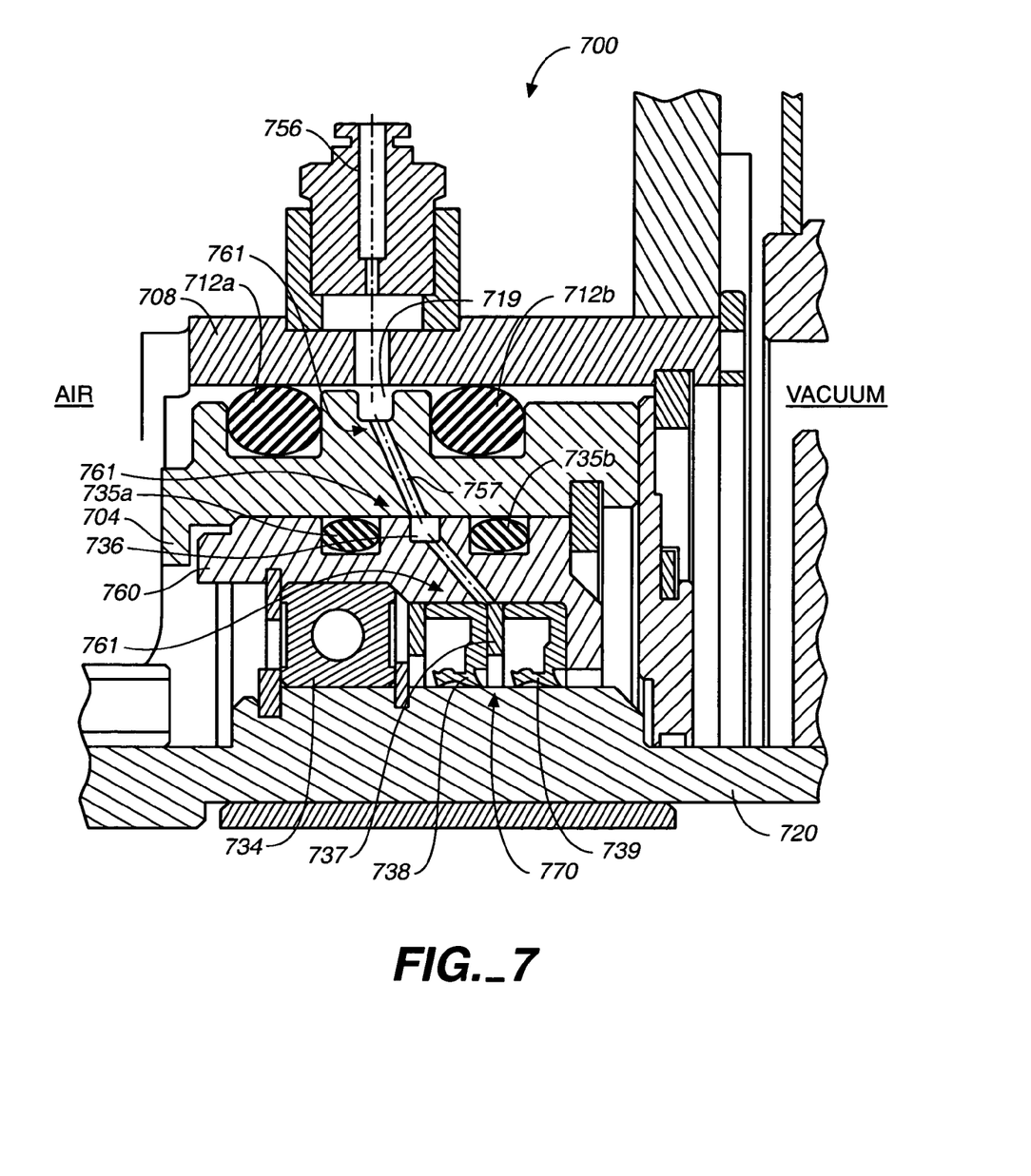
FIG. 7 shows a sealing system used in the water endblock of FIGS. 5 and 6.

FIG. 7 shows a more detailed view of a sealing system that may be used in an endblock such as water endblock 300 of FIGS. 5-6. Reference numbers used in FIG. 7 correspond to those in FIGS. 5-6, where similar parts are referenced but numbers are incremented by 400 in FIG. 7. For example, O-rings 712 (*a* and *b*) in FIG. 7 correspond to o-rings 312 in FIGS. 5-6; water spindle 720 in FIG. 7 corresponds to water spindle 320 in FIGS. 5-6; bearing 734 in FIG. 7 corresponds to bearing 334 in FIG. 5; lip seal 738 in FIG. 7 corresponds to lip seal 338 in FIG. 5; and port 756 in FIG. 7 corresponds to port 356 in FIG. 5. Water spindle 720 is free to rotate within bearing 734. Two lip seals 738 and 739 are located adjacent to bearing 734 in the gap between spindle 720 and bearing and seal carrier 760. Lip seals 738 and 739 are separated by a spacer 737. Lip seals 738 and 739 are located so that they are each individually sufficient to seal the gap between spindle 720 and bearing and seal carrier 760. Thus, if one seal fails then the other is still capable of maintaining vacuum integrity. A seal cavity 770 is formed between lip seals 738 and 739. Cavity 770 is defined by water spindle 720 and bearing and seal carrier 760, which form its inner and outer surfaces respectively, and by seals 738 and 739, which form the end surfaces of cavity 770. Cavity 770 is ring shaped, extending around water spindle 720.

Bearing and seal carrier 760 is located within water endblock isolation housing (WEIH) 704. The gap between bearing and seal carrier 760 and WEIH 704 is sealed by two O-rings 735*a* and 735*b*. Between O-rings 735*a* and 735*b* a seal cavity 736 is formed. Cavity 736 is defined by bearing and seal carrier 760 and WEIH 704, which form its inner and outer surfaces respectively, and by O-rings 735*a* and 735*b*, which form the end surfaces of cavity 736. Cavity 736 is ring shaped, extending around bearing and seal carrier 760.

WEIH 704 is located within water endblock primary housing (WEPH) 708. The gap between WEIH 704 and WEPH 708 is sealed by two O-rings 712*a* and 712*b*. Between O-rings 712*a* and 712*b* a seal cavity 719 is formed. Cavity 719 is defined by WEIH 704 and WEPH 708, which form its inner and outer surfaces respectively, and by O-rings 712*a* and 712*b*, which form the end surfaces of cavity 719. Cavity 719 is ring shaped, extending around WEIH 704.

A channel 757 connects cavities 770, 736 and 719. Channel 757 allows gas to flow between cavities 770, 736 and 719 so that they form a single endblock seal cavity 761. More than one channel may be used to connect cavities in this way to provide better fluid communication between cavities. Endblock seal cavity 761 is connected to port 756. Port 756 may be connected to a vacuum pump to maintain a reduced pressure in endblock seal cavity 761. Thus, the pressure in endblock seal cavity 761 may be maintained at some intermediate pressure between atmospheric pressure and the pressure surrounding the target.

One problem encountered with both drive and water endblocks is vacuum leakage due to failure of the seals. Leakage of air into the evacuated region around the target may affect the process by increasing the pressure and introducing contaminants. Large leaks may prevent sputtering because it is not possible to produce an adequate vacuum to create a plasma.

Both lip seals and O-rings may fail. Mechanical wearing of a seal may cause the seal to fail. In the endblocks described above, lip seals usually fail before O-rings do because lip seals are used to seal a gap between a static part and a rotating part in these examples. To form an improved seal, and to reduce the effect of seal failure, two seals may be used to form a dual seal as described above. This provides redundancy in the sealing system so that if one seal fails, the second seal still ensures that vacuum is maintained. Between the seals a seal cavity, such as seal cavity 770, is formed. A cavity may be connected to a vacuum pump to create a partial vacuum in the cavity. Two or more seal cavities in the same endblock may be connected together to form a single endblock seal cavity such as cavity 761.

Figure 8:
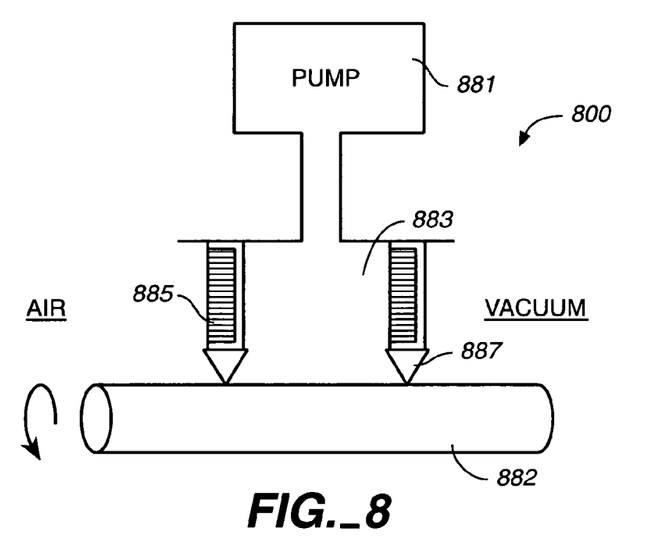
FIG. 8 shows a sealing system used in either the drive endblock of FIGS. 3 and 4 or the water endblock of FIGS. 5 and 6.

FIG. 8 shows a simplified drawing of a differentially pumped sealing system 800, which may incorporate sealing system 400 or 700 or a similar sealing system with a vacuum pump connected to differentially pump a sealing cavity. Differentially pumped sealing system 800 seals against a rotating spindle 882. A vacuum pump 881 is connected to a seal cavity 883. This differentially pumped arrangement produces a large pressure difference across seal 885 separating seal cavity 883 from atmosphere (the airside seal). As the seal cavity 883 is evacuated, this pressure difference approaches one atmosphere (760 Torr). Seal 887 separating seal cavity 883 from vacuum experiences a very small pressure difference when seal cavity 883 is evacuated because there is vacuum on both sides of this seal. Thus, as seal cavity 883 is evacuated the pressure difference across seal 887 approaches zero. Typically, the pressure in the cathode region around a target is about $2 \times 10^{-3}$ Torr during processing, while a seal cavity may be pumped down to 5-100 Torr. Thus, the actual pressure difference is less than 100 Torr across seal 887. The pressure difference across seal 885 is more than 660 Torr.

Generally, a seal experiencing a larger pressure difference will wear more rapidly and will fail sooner than a seal experiencing less pressure difference. A seal experiencing a small pressure difference should have an extended time to failure compared to the same seal if it were exposed to a large pressure difference. Thus, in FIG. 8 airside seal 885 is likely to fail before vacuum side seal 887. When seal 885 fails, seal 887 continues to function and continues to maintain vacuum in the cathode region. This avoids the need to shut down the entire system just to replace a failed seal. However, it is desirable to know that seal 885 has failed so that it may be replaced in a timely manner.

According to one embodiment of the present invention, the failure of a seal may be detected by creating a restriction in a vacuum line connecting a seal cavity to a vacuum pump and by monitoring the pressure in the seal cavity or at a point in the vacuum line that is at a similar pressure to the seal cavity.

Figure 9:
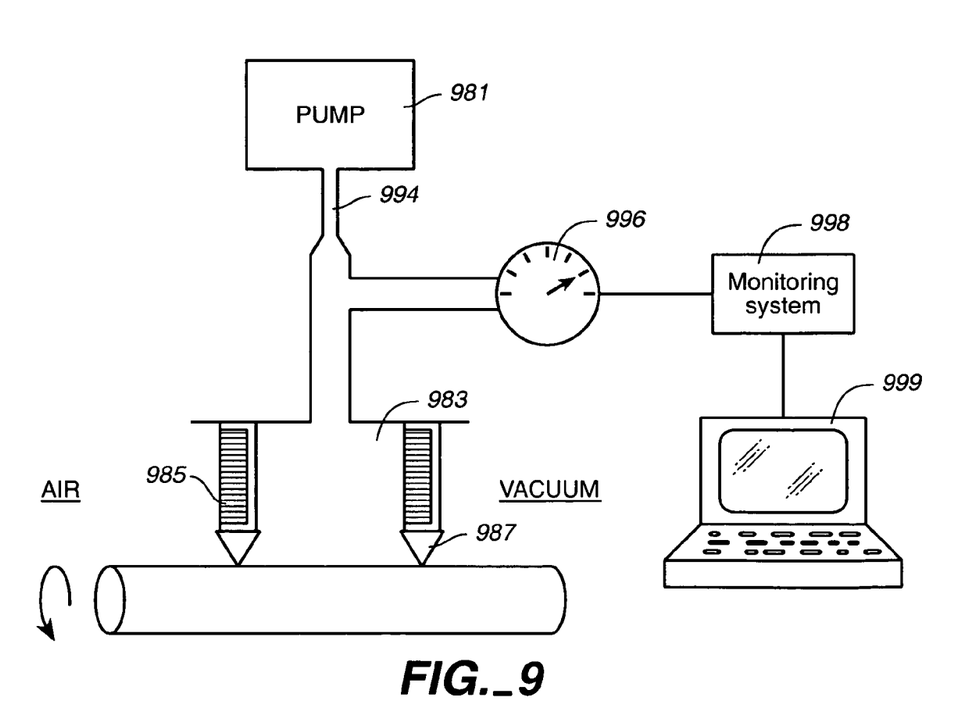
FIG. 9 shows a sealing system similar to that of FIG. 8 but with a restriction, pressure gauge and monitoring system.

FIG. 9 shows a seal cavity 983 connected to a vacuum pump 981 having a restriction 994 between cavity 983 and vacuum pump 981. A pressure gauge 996 is connected to the vacuum line at a point that is between restriction 994 and seal cavity 983. Thus, pressure gauge 996 is connected to seal cavity 983 by an unrestricted line so that the pressure measured by pressure gauge 996 is approximately the same as the pressure in seal cavity 983. Under normal operating conditions, the vacuum pump 981 achieves a target pressure of about −27 inches of Mercury (76 Torr). This pressure is measured by vacuum gauge 996 and the output may be monitored directly by an operator or may be monitored by an automated monitoring system 998.

When seal 985 fails, air leaks into cavity 983. Vacuum pump 981 continues to pump cavity 983. However, because of the restriction 994 in the vacuum line between pump 981 and cavity 983, the pressure in cavity 983 rises. This rise in pressure is detected by pressure gauge 996. When a certain maximum pressure is reached, for example −20 inches of Mercury (250 Torr), an automated monitoring system 998 may begin a routine in response to the condition. This routine could simply involve sending a message to a user console 999 that the pressure in the seal cavity 983 was above a maximum pressure. However, false alarms indicating seal failure may occur if an alarm is sent every time the pressure exceeds some maximum.

In an alternative routine, monitoring system 998 begins a timer when the pressure measured by pressure gauge 996 exceeds the maximum pressure. Air side lip seals that are used between moving parts such as lip seal 985 sometimes provide a "burp" in pressure in a seal cavity. This means that a momentary failure of seal 985 may allow some air to enter seal cavity 983 and cause the pressure to rise. However, such a leak does not persist and if no action is taken then pump 981 will pump out seal cavity 983 and the pressure in seal cavity 983 will return to a steady level below the maximum pressure. It is preferable that such an event should not cause an alarm to be sent by monitoring system 998 because no action is necessary. Instead of sending an alarm under these conditions, a timer may be initiated when the maximum pressure is exceeded. Pressure is monitored for a predetermined time (for example, 30 minutes) to see if the pressure remains above the maximum pressure. If the pressure in cavity 983 returns to a level below the maximum pressure within the predetermined time then no action is required because a "burp" has probably occurred. If the pressure in cavity 983 fails to return to a level below the maximum pressure then an "informational alarm" may be sent by monitoring system 998 to user console 999 to indicate that seal cavity 983 is leaking. An informational alarm indicates a condition that does not require immediate action but is of interest to an operator. Here, no immediate action is needed because seal 987 still maintains a seal, but the alarm informs an operator that seal replacement should be performed when there is an opportunity. For example, a message such as "Coat Zone X Source Bay Y has a high pressure," might be sent to an operator console.

In one embodiment, several endblock seal cavities are connected together so that they may share a common vacuum pump. In this embodiment, an informational alarm indicating seal failure will only indicate that failure has occurred in one of several endblock seal cavities and will not tell an operator which seal is leaking.

Figure 10:
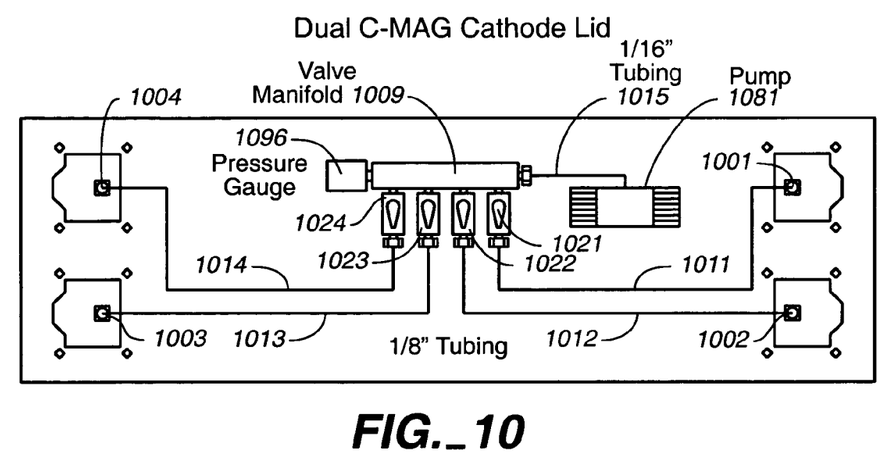
FIG. 10 shows four endblock seal cavities such as those shown in FIGS. 4 and 7.

FIG. 10 shows four endblock seal cavities 1001-1004 connected together by valve manifold 1009. Valve manifold 1009 is in turn connected to a vacuum pump 1081. Vacuum pump 1081 is a diaphragm pump (Micro Dia-Vac® pump) that produces a vacuum in the range of less than 100 Torr. Valve manifold 1009 is connected to each of the seal cavities 1001-1004 by lines 1011-1014. Lines 1011-1014 are ⅛ inch diameter polyflo tubing. In contrast, line 1015 connecting valve manifold 1009 to vacuum pump 1081 is 1/16 inch polyflo tubing. Line 1015 has an outer dimension of 1/16 inches, an inner dimension of 0.02 inches and is 12 inches in length. This smaller diameter line restricts the flow between valve manifold 1009 and vacuum pump 1081 compared with the flow between the seal cavities 1001-1004 and valve manifold 1009. Thus, the line connecting valve manifold 1009 and pump 1081 is itself a restrictor in this example. The restrictor used for different situations depends on a number of variables including the number of seal cavities connected to a pump, the size of the pump, the distance between the pump and the manifold and between the manifold and the cavities. A restrictor could be a fixed orifice, a section of line or the entire line between manifold and pump 1081.

When an alarm occurs, an operator may wish to know which of endblock seal cavities 1001-1004 is leaking. The operator may isolate successive endblock seal cavities so that only one is connected to vacuum pump 1081 at a time and thus determine which endblock seal cavity has a leak. For example, in FIG. 10, valves 1021-1024 could all be closed to check the integrity of the lines between valve manifold 1009 and vacuum pump 1081. Next, valve 1021 is opened so that only endblock seal cavity 1001 is connected to pump 1081. If the pressure rises then endblock seal cavity 1001 is the source of the leak. If the pressure remains low then the leak is elsewhere. Valve 1021 is then closed and valve 1022 is opened to check endblock seal cavity 1002. By checking each endblock seal cavity 1001-1004 in this manner, a leaking cavity may be identified. Once a leaking seal is identified a decision may be made on whether to valve off the corresponding seal cavity or keep pumping on it. A number of variables will aid in this decision as well as the decision to schedule an appropriate time for maintenance of this seal. The sensitivity of the process to leaks and the size of the leak are major factors. Generally, an operator will make the decision of how to deal with a leaking seal based on these and other factors.

Vacuum side seals may also leak. This may be detected in a similar manner to that described above with respect to an airside seal leak. If a vacuum side seal leaks before the airside seal leaks then the pressure in the seal cavity will be reduced below its normal operating pressure. This occurs because the vacuum in the coater is much lower (2-5 mTorr) than the vacuum in the seal cavity (−27 inches of Mercury or 75 Torr). A minimum pressure may be set for the pressure in the seal cavity, for example, −29 inches of Mercury (25 Torr). When the minimum pressure is reached a timer is initiated. If the pressure remains below the minimum pressure for a predetermined period (e.g. 30 minutes) then an informational alarm is sent to an operator. An alarm such as "Coat Zone X Source Bay Y has a low pressure" may be sent to indicate the location and nature of the problem. The operator may then more precisely locate the seal failure by isolating all the seal cavities from the vacuum pump, then connecting them one-by-one to determine which one causes the pressure to drop in a procedure like that described above for an airside seal leak. A leak in a vacuum side seal is more serious than a leak in an airside seal because the vacuum integrity of the coater is compromised. Gas may enter the coater via this leak and cause contamination of the process within the coater. Thus, the sooner a leaking vacuum side seal is replaced the better.

In some embodiments of the present invention, no dedicated vacuum pump is needed to provide vacuum in the seal cavity. Instead, a pump that provides vacuum to the coater is used to provide vacuum to the seal cavities also. Typically, a coater has several pumps to evacuate the large volumes within the coater. To achieve the high level of vacuum required a pumping stack of two or more pumps in series may be used. For example, a diffusion pump may be used in combination with a backing pump such as a mechanical pump to provide high vacuum. Several diffusion pumps may be connected to a single backing pump by a foreline. A gate valve may be between the pump stack and the coater so that the pump stack may be isolated from the coater for maintenance. Thus, a pump may be shut down and fixed without venting the coater to atmosphere. Within the coater there are several zones, each zone having one or more pump stack.

Figure 11:
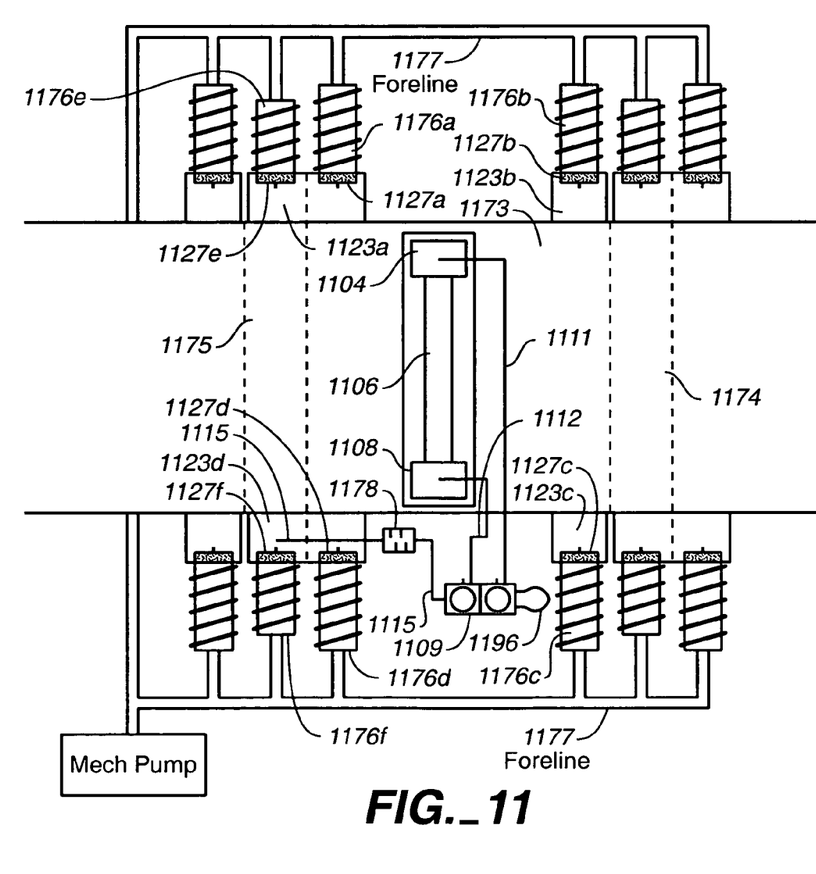
FIG. 11 shows a portion of the coating system of FIG. 1B incorporating multiple endblock seal cavities as shown in FIG. 10.

FIG. 11 shows a portion of a coater including a coat zone 1173 and two interstage zones 1174 and 1175. Four diffusion pumps 1176a-1176d are connected to coat zone 1173. Diffusion pumps 1176a-1176d are attached to plenums 1123a-1123d which are attached to coat zone 1173. Between each of diffusion pumps 1176a-1176d and coat zone 1173 are gate valves 1127a-1127d. Two diffusion pumps 1176e and 1176f are connected to interstage zone 1175. Diffusion pumps 1176e and 1176f are attached to plenums 1123a and 1123d respectively. Between diffusion pump 1176e and interstage zone 1175, there is a gate valve 1127e. Between diffusion pump 1176f and interstage zone 1175, there is a gate valve 1127f. Coat zone 1173 contains a target 1106 used to sputter onto a glass substrate. Endblocks 1104 and 1108 are shown at either end of target 1106. Within each endblock 1104 and 1108 is an endblock seal cavity (not shown). FIG. 11 shows lines 1111, 1112 and 1115 connecting the endblock seal cavities of endblocks 1104 and 1108 respectively to plenum 1123d of interstage zone 1175. This arrangement provides vacuum to the endblock seal cavities without necessitating a separate pump. Because line 1115 connects upstream of gate valve 1127f, the endblock seal cavities of endblocks 1104 and 1108 will be pumped-down as the interior of the coat zone 1173 and interstage zone 1175 are pumped down and will vent-up as they vent-up. This keeps the seal cavity at the desired pressure even when a pump is being serviced. Alternatively, line 1115 could be connected to vacuum elsewhere. For example, line 1115 could connect to foreline 1177. However, this may require line 1115 to be isolated from foreline 1177 during servicing. Another possibility is to connect line 1115 to another zone.

When a seal leaks in endblock 1108, air is drawn into the endblock seal cavity and then through lines 1112 and 1115, through plenum 1123d and gate valve 1127f to pump 1176f. Some air may diffuse from plenum 1123d into interstage zone 1175. However, because this is an interstage zone no sputtering takes place in interstage zone 1175. Therefore, leakage will not directly affect the process. A restrictor 1178 is shown inserted in-line along line 1115. This provides the necessary restriction to allow pressure in the seal cavities to rise. Alternatively, the size of line 1115 may be chosen to adequately restrict the flow between endblocks 1104 and 1108 and pump 1176f so that leakage in endblock 1108 will cause a rise in pressure. Pressure in the seal cavities of endblocks 1104 and 1108 is detected by pressure gauge 1196. Valve manifold 1109 is connected where line 1115 connects to line 1111 from endblock 1104 and line 1112 from endblock 1108. Valve manifold 1109 may be used to identify which of endblocks 1104 and 1108 has a leak using the procedure described with respect to FIG. 10.

Thus, using a vacuum gauge, an in-line gas-flow restricting device and a source of vacuum pumping, real-time monitoring of the status of the endblock seal cavity seals is accomplished. By differentially pumping the seal cavity, the airside seal ring will typically fail before the vacuum side seal ring. Once failed, the airside seal ring will let air pressure into the seal cavity. The increase of pressure will be monitored by use of a vacuum gauge. The retention of pressure is accomplished by using a narrow, short tube (gas-flow restrictor) between the valve manifold and the vacuum pump. The rate of pressure evacuation will be metered by the restrictive device, making it easy to monitor the pressure produced by the smallest leaks.

Thus, using a vacuum gauge, an in-line gas flow restricting device and a source of vacuum pumping, real time monitoring of the status of the endblock seal cavity seals is accomplished. By differentially pumping the seal cavity, the airside seal ring will typically fail before the vacuum side seal ring. Once failed, the airside seal ring will let air pressure into the seal cavity. The increase of pressure will be monitored by use of a vacuum gauge. The retention of pressure is accomplished by using a narrow, short tube (gas flow restrictor) between the valve manifold and the vacuum pump. The rate of pressure evacuation will be metered by the restrictive device, making it easy to monitor the pressure produced by the smallest leaks.

It is to be understood that even though numerous characteristics and advantages of certain embodiments of the present invention have been set forth in the foregoing description, together with details of the structure and function of various embodiments of the invention, this disclosure is illustrative only and changes may be made in detail, especially in matters of structure and arrangement of parts within the principles of the present invention.

It is claimed:

1. An apparatus sufficient to maintain subatmospheric pressure in a chamber comprising rotatable parts mechanically coupled to an exterior of the chamber, the apparatus comprising:
   a static chamber portion;
   a rotatable chamber portion;
   a gap, a first seal and a second seal located between the static chamber portion and the rotatable chamber portion;
   a cavity located between the first seal and the second seal; and
   a monitoring device sufficient to monitor pressure of the cavity and to signal when pressure in the cavity exceeds a predetermined pressure for a predetermined period.

2. An apparatus sufficient to maintain subatmospheric pressure in a chamber comprising rotatable parts mechanically coupled to an exterior of the chamber, the apparatus comprising:
   a static chamber portion;
   a rotatable chamber portion;
   a gap, a first seal and a second seal located between the static chamber portion and the rotatable chamber portion;
   a cavity located between the first seal and the second seal;
   a monitoring device sufficient to monitor pressure of the cavity and to signal when pressure in the cavity exceeds a predetermined pressure; and
   a flow-restricting device connecting a volume at a first reduced pressure to the cavity and sufficient to create a second reduced pressure in the cavity, the second reduced pressure being higher than the first reduced pressure.

3. An apparatus sufficient to maintain subatmospheric pressure in a chamber comprising rotatable parts mechanically coupled to an exterior of the chamber, the apparatus comprising:
   a static chamber portion;
   a rotatable chamber portion;
   a gap, a first seal and a second seal located between the static chamber portion and the rotatable chamber portion;
   a cavity located between the first seal and the second seal;
   a monitoring device sufficient to monitor pressure of the cavity and to signal when pressure in the cavity exceeds a predetermined pressure; and
   a pressure gauge sufficient to communicate pressure in the cavity to the monitoring device.

4. The apparatus of any of claims 1 and 2, further comprising a pressure gauge sufficient to communicate pressure in the cavity to the monitoring device.

5. The apparatus of any of claims 1 and 3, wherein the monitoring device is sufficient to signal when pressure in the cavity exceeds a predetermined pressure for a predetermined period.

6. The apparatus of any of claims 2 and 3, further comprising a flow-restricting device connecting a volume at a first reduced pressure to the cavity and sufficient to create a second reduced pressure in the cavity, the second reduced pressure being higher than the first reduced pressure.

7. The apparatus of any of claims 1-3, further comprising a pressure gauge sufficient to measure pressure in the cavity.

8. The apparatus of any of claims 1-3, further comprising at least one other cavity in communication with the cavity via a conduit, wherein the monitoring device is sufficient to monitor pressure in the conduit.

\* \* \* \* \*